US012030008B2

(12) United States Patent
Cheng et al.

(10) Patent No.: US 12,030,008 B2
(45) Date of Patent: Jul. 9, 2024

(54) PARTICLE REMOVER AND METHOD

(71) Applicant: Taiwan Semiconductor Manufacturing Company, Ltd., Hsinchu (TW)

(72) Inventors: Wen-Hao Cheng, Taichung (TW); Hsuan-Chih Chu, Changhua (TW); Yen-Yu Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 179 days.

(21) Appl. No.: 17/387,951

(22) Filed: Jul. 28, 2021

(65) Prior Publication Data
US 2022/0297037 A1 Sep. 22, 2022

Related U.S. Application Data

(60) Provisional application No. 63/163,727, filed on Mar. 19, 2021.

(51) Int. Cl.
*B01D 45/14* (2006.01)
*C23C 16/44* (2006.01)
*C23C 16/455* (2006.01)

(52) U.S. Cl.
CPC .......... *B01D 45/14* (2013.01); *C23C 16/4407* (2013.01); *C23C 16/45544* (2013.01)

(58) Field of Classification Search
CPC ............... B01D 45/14; C23C 16/4407; C23C 16/45544; C23C 16/45561; C23C 16/4402; C23C 16/455; C23C 16/45525
See application file for complete search history.

(56) References Cited

U.S. PATENT DOCUMENTS

| | | | | |
|---|---|---|---|---|
| 3,517,821 A | * | 6/1970 | Keller | B04C 3/06 210/512.1 |
| 3,802,162 A | * | 4/1974 | Deane | B01D 47/10 261/DIG. 54 |
| 3,929,416 A | * | 12/1975 | Tanaka | C01F 11/46 366/156.1 |
| 4,162,906 A | * | 7/1979 | Sullivan | B04C 3/00 210/512.1 |
| 4,173,458 A | * | 11/1979 | Stiles | B01D 45/14 55/405 |
| 4,281,934 A | * | 8/1981 | Krause | E01C 19/46 366/326.1 |

(Continued)

FOREIGN PATENT DOCUMENTS

DE 102018006620 B4 * 3/2023 ............. B01D 45/14

*Primary Examiner* — Dung H Bui
(74) *Attorney, Agent, or Firm* — Kilpatrick Townsend & Stockton LLP

(57) ABSTRACT

A device for removing particles in a gas stream includes a first cylindrical portion configured to receive the gas stream containing a target gas and the particles, a rotatable device disposed within the first cylindrical portion and configured to generate a centrifugal force when in a rotational action to divert the particles away from the rotatable device, a second cylindrical portion coupled to the first cylindrical portion and configured to receive the target gas, and a third cylindrical portion coupled to the first cylindrical portion and surrounding the second cylindrical portion, the third cylindrical portion being configured to receive the diverted particles.

20 Claims, 12 Drawing Sheets

(56) References Cited

U.S. PATENT DOCUMENTS

| | | | | |
|---|---|---|---|---|
| 4,460,393 A * | 7/1984 | Saget | ............ | B04B 5/12 209/714 |
| 4,766,717 A * | 8/1988 | Thomann | ............ | A01F 15/106 56/364 |
| 5,171,446 A * | 12/1992 | Shen | ............ | B01D 45/14 210/512.3 |
| 5,494,501 A * | 2/1996 | Anspach | ............ | B01D 46/2411 96/219 |
| 5,716,423 A * | 2/1998 | Krul | ............ | B01D 45/14 55/487 |
| 5,755,096 A * | 5/1998 | Holleyman | ............ | B01D 45/14 60/407 |
| 6,033,450 A * | 3/2000 | Krul | ............ | B01D 45/14 55/438 |
| 6,110,246 A * | 8/2000 | Eubank | ............ | B01D 45/14 55/394 |
| 6,280,493 B1 * | 8/2001 | Eubank | ............ | B01D 45/14 55/401 |
| 6,540,802 B2 * | 4/2003 | Trautmann | ............ | F02M 35/168 55/432 |
| 6,713,112 B1 * | 3/2004 | Lucas | ............ | B01D 50/40 55/423 |
| 6,872,232 B1 * | 3/2005 | Pavlatos | ............ | F02C 7/055 55/306 |
| 7,637,978 B2 * | 12/2009 | Jung | ............ | F02M 35/10013 55/424 |
| 7,835,483 B2 * | 11/2010 | Chaki | ............ | B04C 3/00 376/361 |
| 8,746,464 B2 * | 6/2014 | Maier | ............ | B04C 11/00 210/197 |
| 2002/0139249 A1 * | 10/2002 | Livingston | ............ | B01D 45/14 55/406 |
| 2008/0009402 A1 * | 1/2008 | Kane | ............ | B04B 5/08 494/53 |
| 2008/0047239 A1 * | 2/2008 | Zheng | ............ | B01D 45/14 55/428 |
| 2009/0025562 A1 * | 1/2009 | Hallgren | ............ | B04B 5/005 96/216 |
| 2009/0266231 A1 * | 10/2009 | Franzen | ............ | B03C 3/15 96/28 |
| 2009/0266235 A1 * | 10/2009 | Kane | ............ | B04B 5/10 55/400 |
| 2011/0048696 A1 * | 3/2011 | Holte | ............ | B01D 19/0057 96/195 |
| 2012/0067788 A1 * | 3/2012 | Boele | ............ | B01D 45/14 209/132 |
| 2012/0103423 A1 * | 5/2012 | Schook | ............ | B04C 3/00 137/1 |
| 2012/0233973 A1 * | 9/2012 | Sedillo | ............ | B04C 3/06 55/342.2 |
| 2013/0061759 A1 * | 3/2013 | Laor | ............ | F16L 55/02772 96/306 |
| 2018/0250620 A1 * | 9/2018 | Vingelven | ............ | B01D 45/08 |
| 2018/0361288 A1 * | 12/2018 | Nie | ............ | B01D 45/16 |
| 2019/0009205 A1 * | 1/2019 | Oberli | ............ | B01D 46/0045 |
| 2020/0208265 A1 * | 7/2020 | Hsieh | ............ | H01M 10/4235 |
| 2020/0353394 A1 * | 11/2020 | Chen | ............ | B01D 45/14 |
| 2021/0060582 A1 * | 3/2021 | Son | ............ | B04C 5/04 |
| 2021/0079522 A1 * | 3/2021 | Wu | ............ | B01D 45/12 |
| 2021/0093990 A1 * | 4/2021 | Akasaka | ............ | B01F 23/21 |
| 2021/0102522 A1 * | 4/2021 | Parikh | ............ | B01D 45/14 |
| 2021/0123651 A1 * | 4/2021 | Liu | ............ | F25C 1/24 |

* cited by examiner

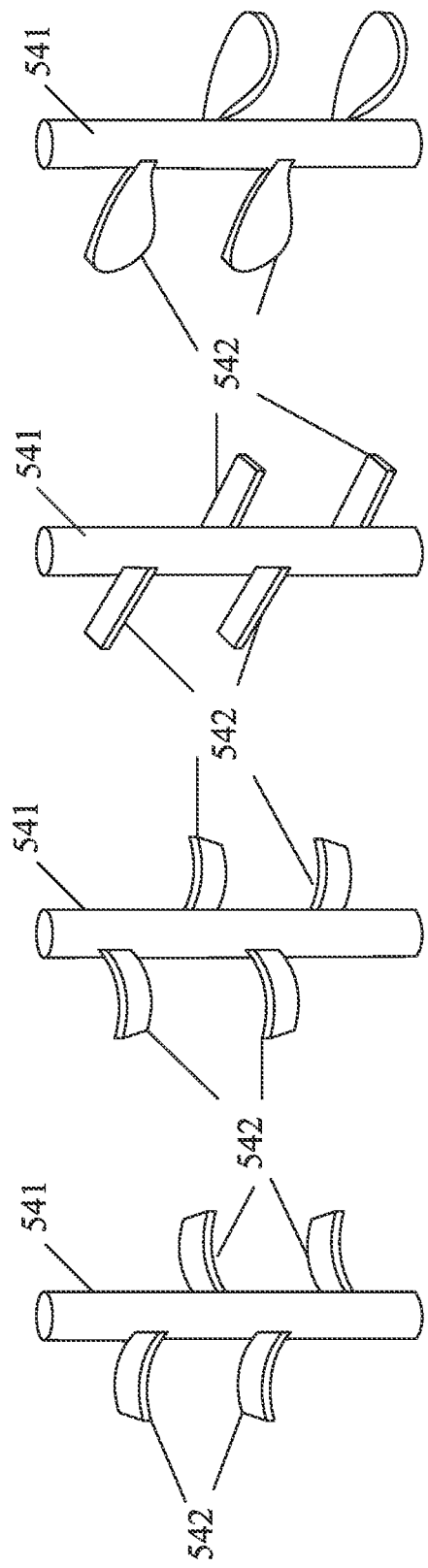

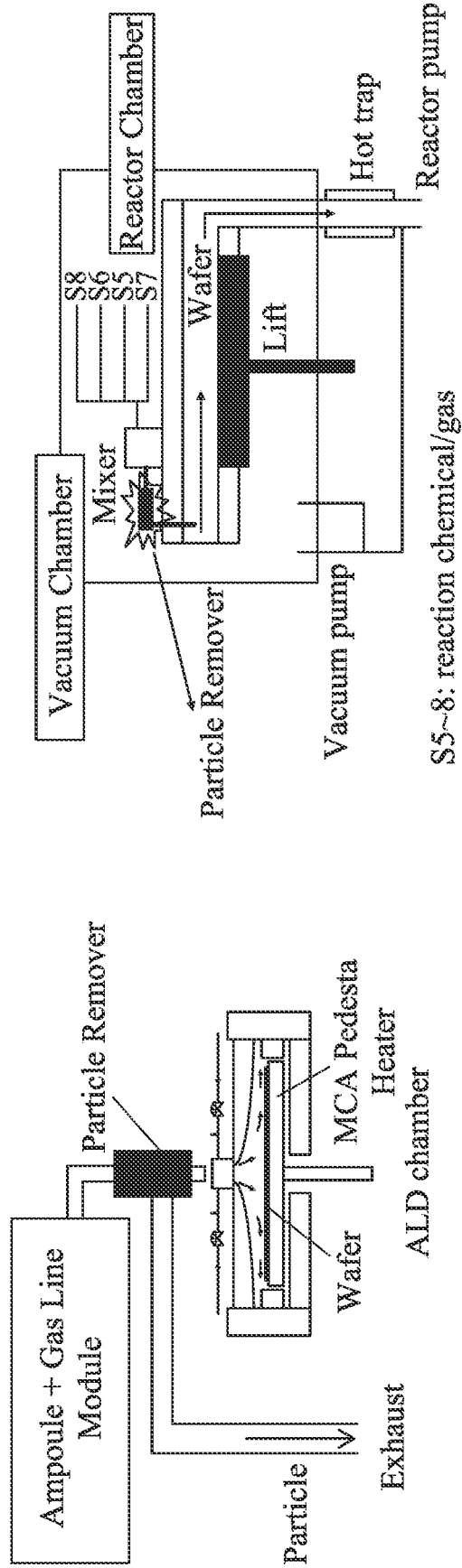
FIG. 10
FIG. 9
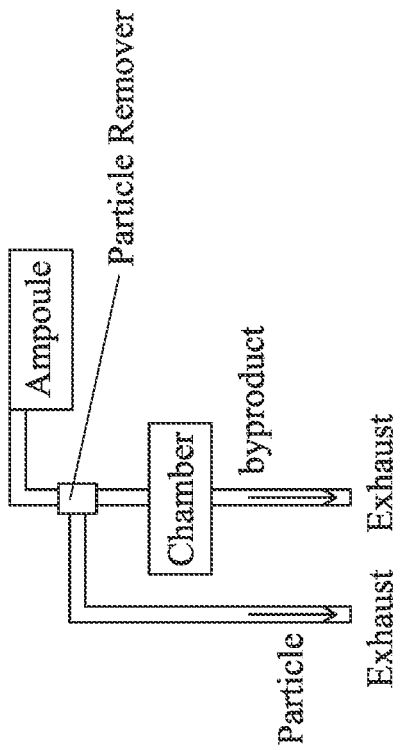
FIG. 11

PARTICLE REMOVER AND METHOD

CROSS-REFERENCE TO RELATED APPLICATIONS

The application claims priority to U.S. Provisional Patent Application 63/163,727 filed Mar. 19, 2021, entitled "Particle Remover and Method," the entire disclosure of which is incorporated herein by reference.

TECHNICAL FIELD

The disclosure relates generally to wafer process equipment, and more specifically to an apparatus, system, and method for delivering reactant gases to processing chambers.

BACKGROUND

Chemical vapor deposition (CVD) is a vacuum deposition process to produce high-quality thin films. In chemical vapor deposition, a substrate (wafer) is exposed to one or more precursors (also called "precursor gases," "reactants," "reactant gases", or "gaseous species"), which decompose on the substrate surface to produce a desired deposit. The deposition rate is controlled by a temperature or an amount of precursors. Frequently, volatile by-products are also produced, which are then removed by a gas flow through the reaction chamber. In some cases, the precursor gases are contained in gaseous form in precursor source containers. In other cases, the precursors are liquid or solid at ambient temperature and pressure and are to be heated to produce sufficient amounts of vapor for the chemical vapor deposition process.

Atomic layer deposition (ALD) is a process in the semiconductor industry for forming thin films on substrates. ALD is a subclass of chemical vapor deposition (CVD) based on the sequential use of a gas-phase chemical process. Many applications of ALD use two chemicals called precursors. These precursors react with the surface of a material one at a time in a sequential manner. During atomic layer deposition, a film is grown on a substrate or wafer by exposing the surface of the substrate (wafer) to alternate (separate) precursors. The thickness of the thin film is determined by the number of ALD cycles performed. By varying the number of ALD cycles, it is possible to grow materials uniformly and with high precision on arbitrary complex and large substrates. ALD can produce very thin, conformal films with control of the thickness and composition of the films at the atomic level. In atomic layer depositions, gaseous precursors are introduced sequentially in a non-overlapping manner to the substrate to form a thin film. One precursor (reactant) adsorbs on the substrate. A different precursor (reactant) reacts with the adsorbed material to form an atomic layer of the desired material. As a liquid or solid precursors are heated to produce sufficient amounts of vapor, solid or liquid particles may also be produced.

BRIEF DESCRIPTION OF THE DRAWINGS

The present disclosure is best understood from the following detailed description when read with the accompanying figures. It is noted that, in accordance with the standard practice in the industry, various features are not drawn to scale and are used for illustration purposes only. In fact, the dimensions of the various features may be arbitrarily increased or reduced for clarity.

FIGS. 5A-D are perspective view diagrams illustrating a plurality of blades arranged on a surface of a rotatable shaft according to some embodiments.

FIG. 9 illustrates an example apparatus employing a particle remover in accordance with the disclosure.

FIG. 10 illustrates another example apparatus employing a particle remover in accordance with the disclosure.

FIG. 11 illustrates still another example apparatus employing a particle remover in accordance with the disclosure.

DETAILED DESCRIPTION OF THE INVENTION

Figure 1A:
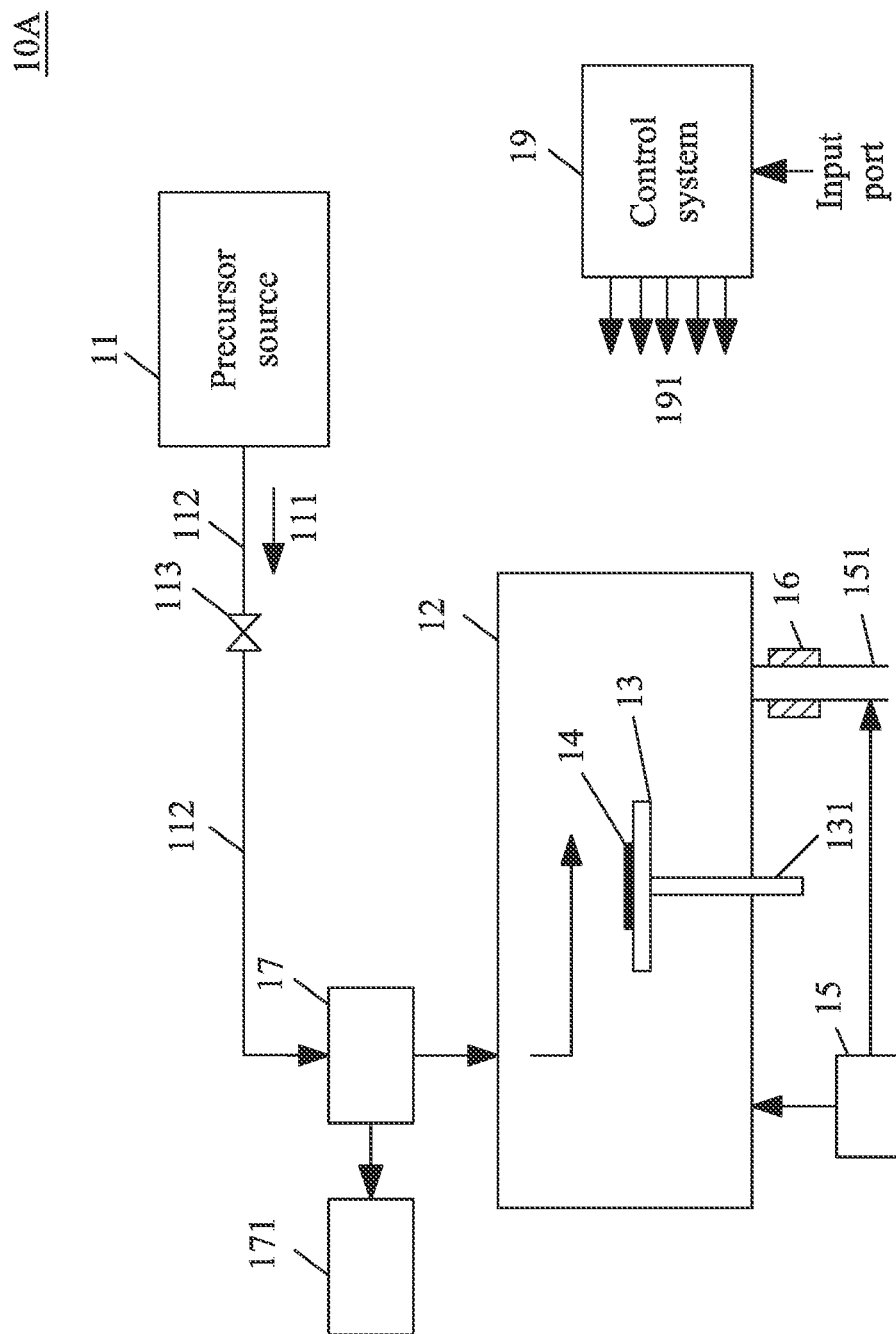
FIG. 1A is a simplified schematic diagram of a system for delivering a reactant gas to a reaction chamber according to an embodiment.

The present disclosure provides many different embodiments, or examples, for implementing different features of the provided subject matter. Embodiments disclosed herein are merely examples and are not intended to be limiting. For example, dimensions of elements are for illustration only and should not be construed to limit ranges or values of those dimensions in accordance with the disclosure. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Numerous benefits and advantages are achieved by way of the present disclosure over conventional techniques. In some processes, as the precursor gases are provided to the reaction chamber, dispersed solid or liquid particles may also be introduced to the reaction chamber, thereby affecting wafer quality and yield. These precursor particles can cause non-uniform deposition of materials (e.g., copper, tungsten, titanium, dielectric) in the reaction chamber, and these particles can be trapped in through-holes causing non-completely filled vias, thereby lowering the number and quality of semiconductor devices. These precursor particles can clog the gas conduits (lines) from a precursor source to the reaction chamber. Furthermore, these precursor particles can clog the valves disposed between the precursor source and the reaction chamber. Clogging of the gas conduits and/or valves can cause equipment downtime.

Therefore, there is a need for an apparatus and method for improving quality of precursors provided to reaction chambers. Embodiments in accordance with the present disclosure can overcome aforementioned problems. In some embodiments, a particle remover is provided for removing precursor particles that can enter a reaction chamber. This can improve purify gas stream and reduce unwanted particle's impact on a wafer. In various embodiments, the particle remover can have a variety of physical features to adapt to different gas conduits. In various embodiments, the particle remover can be easily and quickly installed at various locations in conventional wafer process equipment, where the precursor particles need to be removed from a gas stream before the gas stream enters the reaction chamber. These and other embodiments of the disclosure, along with many of its advantages and features, are described in more detail in conjunction with the text below and corresponding figures.

FIG. 1A is a simplified schematic diagram of a system 10A for delivering a reactant gas to a reaction chamber according to an embodiment. Referring to FIG. 1A, the system 10A may include a precursor source 11 configured to deliver a reactant gas 111 to a reaction chamber 12 through a gas conduit 112. In one embodiment, a valve 113 may be installed in the gas conduit 112 to open or close the gas conduit 112 for controlling a gas flow. The precursor source 11 may include a chemical (a reactant) that is heated to become a vapor (reactant gas) to be provided to the reaction chamber 12 through the gas conduit 112. The reaction chamber 12 may include a wafer platform 13 for holding a wafer (substrate) 14 to be processed. The wafer platform 13 may be rotated at a predetermined speed through a rotating device 131. The system 10A may also include a vacuum pump 15 coupled to an exhaust conduit 151 for removing exhaust gases (e.g., reaction byproducts) in the reaction chamber 12. The vacuum pump 15 is coupled to the reaction chamber 12 to generating a vacuum in the reaction chamber. The pressure difference between the precursor 11 and the reaction chamber 12 causes the vapor to flow toward the reaction chamber where it reacts with a surface of the wafer 14. A heating device 16 may be disposed in the vicinity of the exhaust conduit 151 for heating the exhaust conduit to prevent condensation of the exhaust gases in the exhaust conduit 151.

As the reactant gas 111 flows through the gas conduit 112, some of the vapor may be condensed in the gas conduit 112 to form particles due to some cold spots in the gas conduit 112 and/or any other causes. As used herein, the term "particles" may be referred to particulates that include one or more particles. Examples of particles can be impurities, dust, contaminants, elements that are not a part of deposition manufacturing processes. The particles are unwanted and can have a size greater than a size of the vapor atoms and vapor molecules for the deposition manufacturing processes. The particles can also be unwanted when they are in the liquid or solid state instead of in a vapor state. Such particles are unwanted because, as the particles come into the reaction chamber, they may be deposited on the surface of the wafer, thereby preventing the formation of a thin, uniform, and conformal layer. In accordance with some exemplary embodiments, a particle remover 17 is installed between the precursor source 11 and the reaction chamber 12 and configured to remove unwanted particles that can be entrained in the reactant gas stream before the reactant gas enters the reaction chamber. In one embodiment, the system 10A may also include a collection reservoir 171 coupled to the particle remover 17 and configured to collect the removed particles for recycling.

As shown, in this embodiment, the system 10A further includes a control system 19 for generating a plurality of control signals 191 to the precursor source 11, the valve 113, the rotating device 131, the vacuum pump 15, the heating device 16, the particle remover 17, and the collection reservoir 171. The control system 19 may include an input port configured to receive inputs from a user, a power supply module (not shown) configured to supply power to components and devices of the system 10A. The control system 19 may include a plurality of control boxes containing one or more controllers. For example, the control system 19 may include a first control box including at least one controller or processing unit (processor) coupled to the precursor source 11 for heating and controlling the vaporization of a reactant (e.g., a volume of the reactant gas), a second control box including at least one controller or processor coupled to the valve 113 for controlling the flow of the reactant gas by opening or closing the valve, a third control box including at least one controller or processor coupled to the vacuum pump 15 for controlling the air pressure in the reaction chamber, a fourth control box including at least one controller or processor coupled to the heating device 16 for controlling the temperature of the exhaust conduit 151, and a fifth control box including at least one controller or processor coupled to the particle remover 17 for controlling a rotatable device. In one embodiment, several control boxes may be integrated into one control box for performing different functions. For example, one single control box may have a first controller configured to control the operations of the vacuum pump 15, the internal temperature of the reaction chamber, the heating device 16, and a second controller configured to control the operation of the valve 113 and the particle remover 17. One of skill in the art will appreciate that there can be many alternatives, modifications, and variations.

Figure 1B:
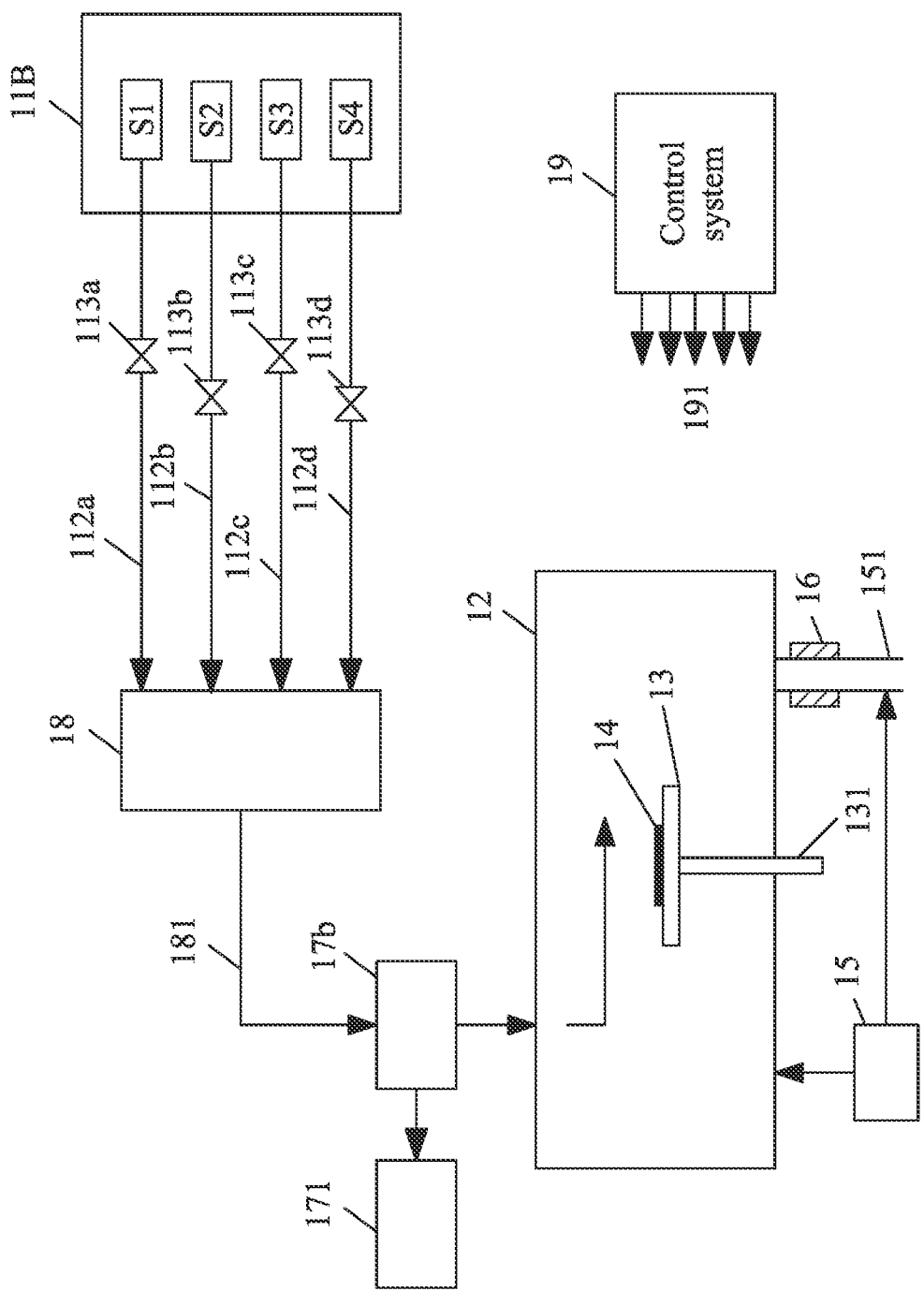
FIG. 1B is a simplified schematic diagram of a system for delivering one or more reactant gases to a reaction chamber according to another embodiment.

FIG. 1B is a simplified schematic diagram of a system 10B for delivering one or more reactant gases to a reaction chamber according to another embodiment. The system 10B differs from the system 10A by having a mixer configured to mix gases from different precursor sources prior to providing the mixed gases to the particle remover. Referring to FIG. 1B, in this embodiment, the system 10B includes a precursor source container 11B having a plurality of precursor sources, e.g., first precursor source S1, second precursor source S2, third precursor source S3, and fourth precursor source S4. For example, the first precursor source S1 is configured to provide an inert (inactive) gas, such as argon or nitrogen, the second reactant source S2 for providing oxygen, the third reactant source S3 for providing HF gas, the fourth reactant source for providing ammonia gas that are provided to a reaction chamber 12 through a plurality of conduits. These materials are only examples. One of skill in the art will appreciate that the precursor source container 11B can have many other reactant sources. In one implementation, the precursor sources S1 through S4 each are connected to a mixer 18 via first through fourth gas conduits 112a, 112b, 112c, and 112d, respectively. The different gases can be mixed by the mixer 18.

In this embodiment, the system 10B includes a plurality of valves 113a, 113b, 113c, and 113d associated with the respective first, second, third, and fourth gas conduits 112a, 112b, 112c, and 112d. The valves are configured to control the gas flow between the precursor sources and the mixer 18. For example, the valves can be used to control the flow of an inert gas or a reactant gas, the reactant gas concentration by opening and closing the gas conduits, thereby achieving reactant gas pulsing. In some thin film deposition processes, e.g., in atomic layer deposition (ALD) processes, a first reactant gas in a vapor state is provided to a gas conduit in a pulse form, i.e., the reactant gas pulses each have a certain gas concentration during a first time period, then substantially no gas concentration in a second time period. The gas concentration pulses with the first time period are separated by the second time period. The pulses can be implanted by controlling the opening and closing time of the respective valve. It is understood that the number of precursor sources, the gas conduits, the valves can be any integer number. In the exemplary embodiment shown in FIG. 1B, four precursor sources, four gas conduits, and four valves are used, but it is to be understood that the number is illustrative only and is chosen for describing the exemplary embodiment and should not be limiting.

Referring still to FIG. 1B, a particle remover 17b is disposed between the mixer 18 and the reaction chamber 12. The particle remover 17b is configured to pass the mixed gas flow provided by the mixer to the reaction chamber, and remove unwanted particles that are entrained in the mixed gas and may cause non-uniform deposition and other defects on the wafer to be processed in the reaction chamber. In this embodiment, the reaction chamber 12 includes a wafer platform 13 for holding a wafer (substrate) 14 to be processed. The wafer platform 13 may be rotated at a predetermined speed through a rotating device 131. In this embodiment, the system 10B also includes a vacuum pump 15, which is coupled to an exhaust conduit 151, for removing exhaust gases (e.g., reaction byproducts) in the reaction chamber 12. The vacuum pump 15 is connected to the reaction chamber 12 to generate a vacuum in the reaction chamber. The pressure difference between the precursor 11 and the reaction chamber 12 can cause the vapor to flow toward the reaction chamber where it reacts with a surface of the wafer 14. A heating device 16 may be disposed in the vicinity of the exhaust conduit 151 for heating the exhaust conduit to prevent condensation of the exhaust gases in the exhaust conduit 151.

Figure 1C:
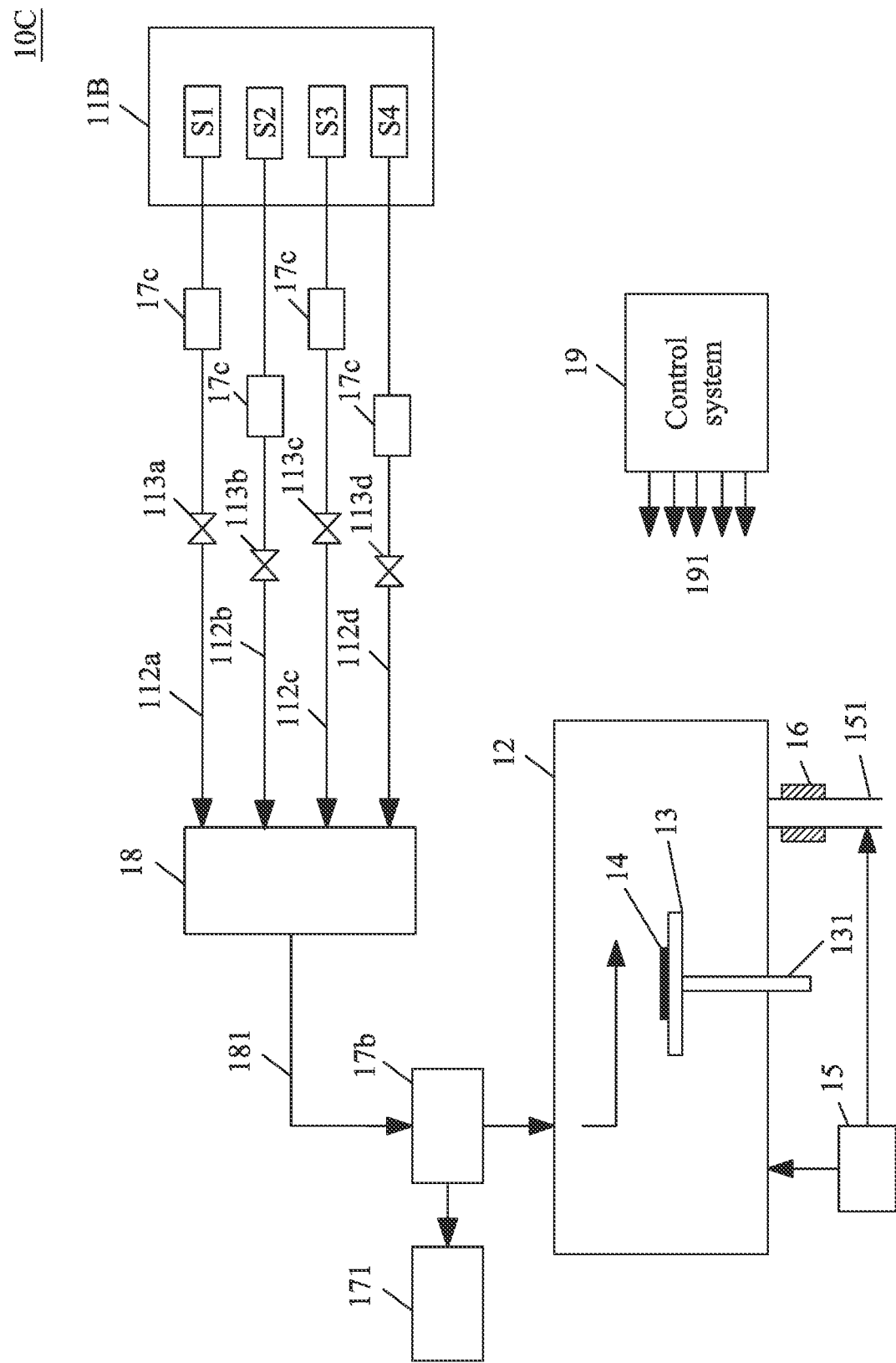
FIG. 1C is a simplified schematic diagram of a system for delivering one or more reactant gases to a reaction chamber according to yet another embodiment.

FIG. 1C is a simplified schematic diagram of a system 10C for delivering one or more reactant gases to a reaction chamber according to yet another embodiment. Referring to FIG. 1C, the system 10C is substantially similar to the system 10B except for the differences described herein. One difference is that, in the system 10C, a particle remover is disposed in the gas conduit and configured to remove particles in a gas prior to providing the gas to the mixer. Accordingly, description provided in relation to the elements illustrated in FIG. 1B is applicable to the elements illustrated in FIG. 1C as appropriate.

As shown in FIG. 1C, a plurality of particle removers 17c may be disposed in the gas conduits 112a, 112b, 112c, and 112d that connect the reactant sources S1, S2, S3, and S4 with the mixer 18. Each of the particle removers 17c is configured to remove unwanted particles that can clog the gas conduits and the valves disposed between the precursor sources and the mixer 18. In one implementation, the particle removers 17c is placed between the precursor sources and the valves, as shown in FIG. 1C. However, this is not intended to be limiting. In some other embodiments, the particle removers 17c may be placed between the valves and the mixer 18. Alternate embodiments, differing from those described herein, will be apparent to persons skilled in the art based on the teaching in accordance with the present disclosure.

Figure 1D:
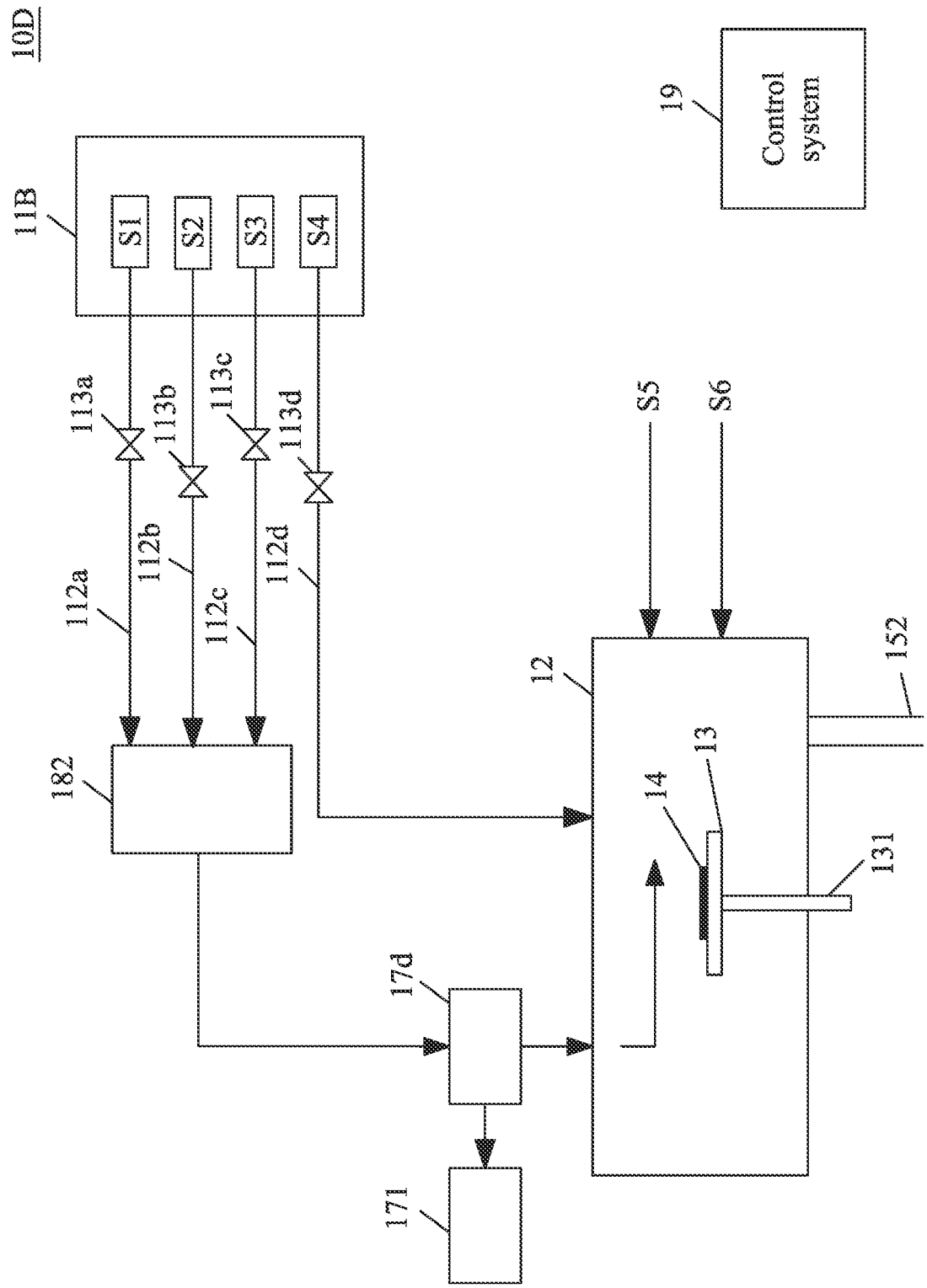
FIG. 1D is a simplified schematic diagram of a system for delivering one or more reactant gases to a reaction chamber according to yet another embodiment.

FIG. 1D is a simplified schematic diagram of a system 10D for delivering one or more reactant gases to a reaction chamber according to yet another embodiment. Referring to FIG. 1D, the system 10D may be a CVD/ALD reactor substantially similar to the system 10B except for the differences described herein. One of the difference in the system 10D is that some precursor sources can be connected to the reaction chamber without having a particle remover disposed therebetween. Accordingly, description provided in relation to the elements illustrated in FIG. 1B is applicable to the elements illustrated in FIG. 1D as appropriate. Referring to FIG. 1D, the system 10D in this embodiment includes a precursor source container 11B having a plurality of precursor sources S1, S2, S3, and S4. In this embodiment, the system 10D includes a plurality of purging gas sources S5 and S6. In this embodiment, the flow of the precursor sources are controlled by respective valves 113a, 113b, 113c, and 113d. As can be seen, the precursor sources S1, S2, S3, and S4 are connected to a collector device 182 that can provide individual precursor gases to a particle remover 17d. However, this not intended to be limiting. For example, the precursor source S4 can be provided directly to the reaction chamber 12 without going through the collector 182. In some other embodiments, the collector 182 may have individual conduits for receiving respective precursor gases. In other embodiments, the collector 182 can be a mixer such as the mixer 18 shown and described in FIG. 1C. That is, not all precursors pass through the particle remover 17d. In some embodiments, a particle remover can be installed in each of the precursor source S4, and the purging gas sources S5, S6. In some embodiments, the reaction chamber 12 may have an outlet port coupled to an exhaust pump or vacuum pump 152 for removing excess precursor gases, purging gases, and byproduct gases from the reaction chamber 12. In this embodiment, a controller system 19 controls the flow and sequence of the precursor gases, purging gases, the temperature of the substrate 14 by heating the platform 13, and operations of the particle remover 17d, and/or any other suitable operations.

Figure 2:
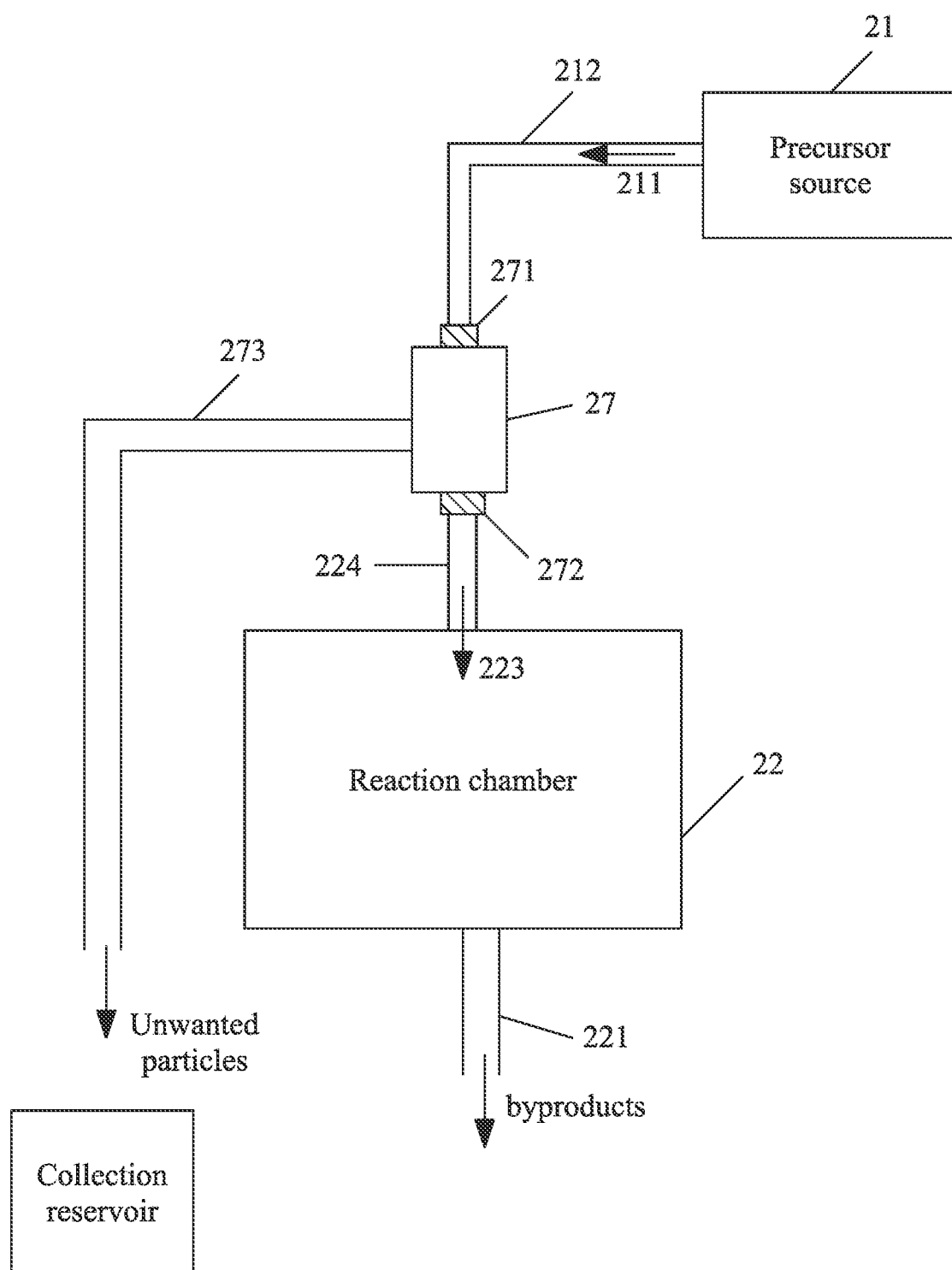
FIG. 2 is a simplified schematic diagram of a basic wafer process system according to some embodiments.

FIG. 2 is a simplified schematic diagram of a basic wafer process system 20 according to some embodiments. The basic wafer process system 20 in accordance with those embodiments may be a part of the system 10A, 10B, 10C, and 10D shown in FIGS. 1A, 1B, 1C, and 1D. Those embodiments are useful for removing unwanted particles present in a gas stream in wafer process equipment used in thin-film deposition processes. As shown, in this embodiment, the basic wafer process system 20 includes a precursor source 21, a reaction chamber 22, and a particle remover 27 disposed between the precursor source 21 and the reaction chamber 22. The reaction chamber 22 includes an outlet port 221 configured to allow byproducts from exiting the reaction chamber.

As shown, in this embodiment, the particle remover 27 includes an inlet port 271 connected to a gas conduit 212 for receiving a gas stream 211 provided by the precursor source 21, an outlet port 272 connected to a gas conduit 224 for providing a reactant gas 223 to the reaction chamber 22. In some implementations, by way of non-limiting example, the inlet port 271 of the particle remover 27 may include internal threads or external threads that match the external threads or internal threads of a coupling nut that is configured to mechanically connect the inlet port 271 with the gas conduit 212. Similarly, in some implementations, by way of non-limiting example, the outlet port 272 of the particle remover 27 may include internal threads or external threads that match the external threads or internal threads of a coupling nut configured to mechanically connect the outlet port 272 with the gas conduit 224. In some implementations, by way of non-limiting example, the particle remover 27 may include fastening elements, such as screws or nut and bolt combinations to mechanically connect the inlet port 271 of the particle remover 27 with the gas conduit 212, and the outlet port 272 of the particle remover 27 with the gas conduit 224. By utilizing threads or fastening elements (e.g., screws, nuts and bolts), the particle remover 27 can be easily and quickly installed and removed (replaced) in the wafer process system 20. In one embodiment, the particle remover 27 can also include an output port 273 configured to divert unwanted particles entrained in the gas stream 211 to a collection reservoir for recycling.

Figure 3:
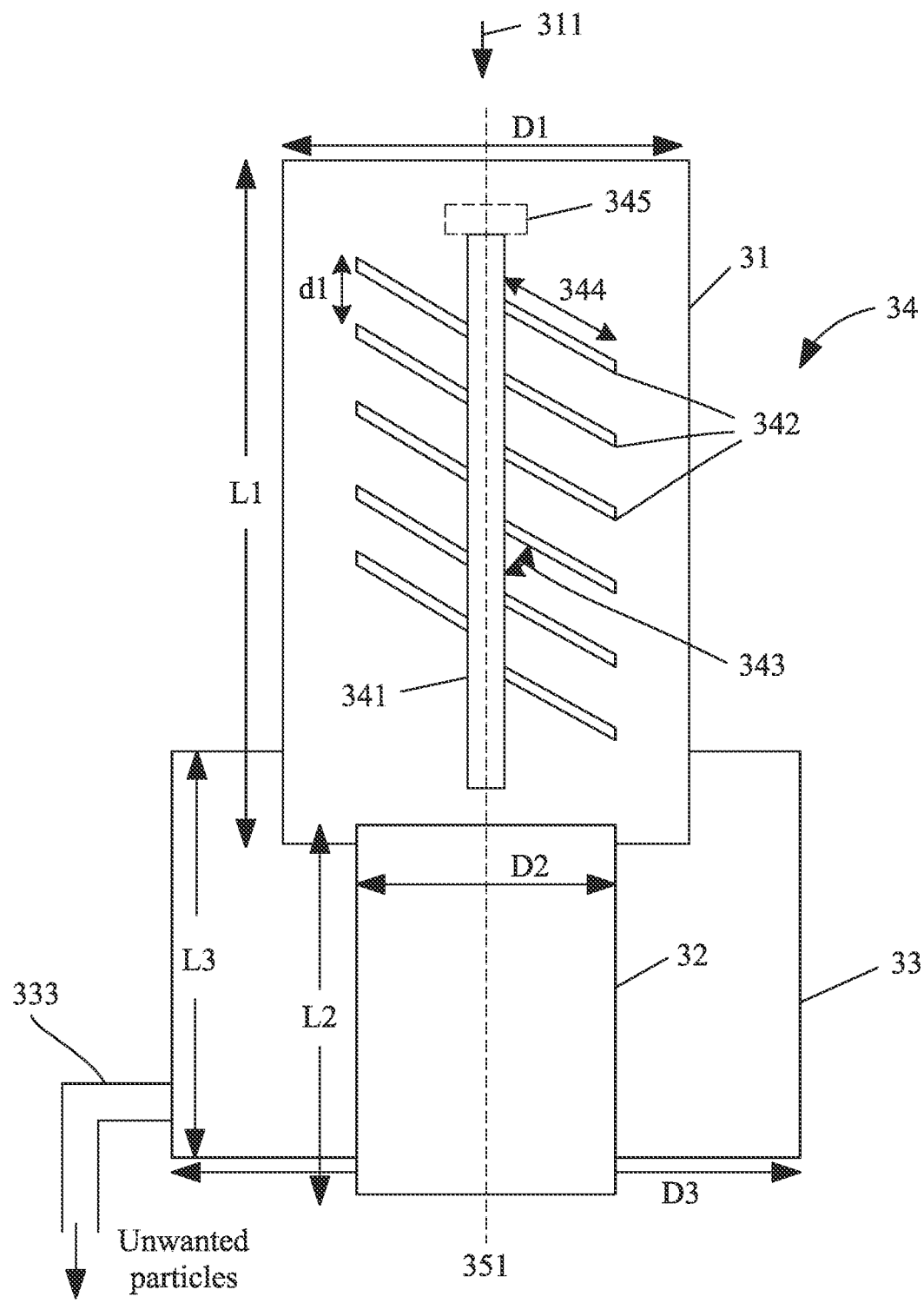
FIG. 3 is a simplified schematic diagram of a particle remover according to some exemplary embodiments.

FIG. 3 is a simplified schematic diagram of a particle remover 30 according to some embodiments. In various embodiments, structures shown for particle remover 30 may be included in the particle remover 17, 17b, 17c, 17d, and 27 shown and described with reference to FIGS. 1A, 1B, 1C, 1D, and 2, respectively. The inlet port and the outlet port are not shown for particle remover 30 for the sake of clarity. As shown, in those embodiments, the particle remover 30 includes a first portion 31, a second portion 32, and a third portion 33. As also shown, in those embodiments, the particle remover 30 includes a rotatable device 34 having a rotatable shaft 341, and a plurality of blades 342 arranged on a surface of the rotatable shaft 341. The rotatable device 34 is disposed within the first portion 31. The first portion 31 is coupled to a precursor source or a gas mixer through a conduit (not shown) for receiving a gas stream 311 containing target reactant gases and unwanted particles which generally have a size or masse greater than the size and masse of the target reactant gases. As shown, in those embodiments, the gas stream enters the first portion 31 at a certain flow rate generated by the pressure difference between the precursor source and the reaction chamber. The certain flow rate can rotate the rotatable device 34 at a rotation speed to generate a centrifugal force. Relatively large sized unwanted particles are separated from the target reactant gases by the generated centrifugal force and diverted toward a peripheral inner wall of the first portion 31. In some implementations, the rotatable device 34 includes an electric motor 345 coupled to the rotatable shaft 341 for rotating the rotatable shaft to generate a centrifugal force that ejects or diverts oversized unwanted particles away from the rotatable shaft 341. The electric motor 345 is driven by an electrical signal provided by a controller external to the particle remover 30. In some implementations, the electric motor rotates the rotatable shaft only when a gas stream is provided to the first portion 31. Although the electric motor 345 is shown, it is understood that the rotatable device 34 may be self-rotating without the electric motor 345 in some other embodiments.

As shown, in those embodiments, the second portion 32 includes an elongated housing coupled to the first portion 31 for receiving the target reactant gases and providing the target reactant gases to the reaction chamber. The third portion 33 includes an elongated housing coupled to the first portion 31 for receiving the unwanted particles and an output port 333 for disposing the unwanted particles to a collection reservoir for recycling. In some implementations, the first, second, and third portions each can be square, hexagonal, octagonal or other conventional cylindrical shapes. In some implementations, the first, second, and third portions each can have an elongated cylindrical body sharing a same longitudinal center axis 351, and the rotatable shaft 341 can be configured to rotate around the same longitudinal center axis 351.

In embodiments where the first, second, and third portions each are circular cylinders, as shown here, the first portion 31 has a first length L1 and a first diameter D1, the second portion 33 has a second length L2 and a second diameter D2, and the third portion 33 has a third length L3 and a diameter D3. In embodiments where the first, second, and third portions each are polygonal cylinders, the parameters D1, D2, and D3 may be the largest widths of the respective first, second, and third portions. As shown, the blades 342 are disposed in a stagger arrangement at a predetermined distance d1 and a predetermined angle 343 on the surface of the rotatable shaft 341. In some embodiments, the blades 342 can have a length 344 that is significantly smaller than the diameter D1 of the first portion 31. In one embodiment, the ratio of the blade length 344 and the diameter D1 of the first portion is in a range between 2.0 percent and 12 percent. In one embodiment, the ratio of the blade length 344 and the diameter D1 of the first portion is in a range between 1.0 percent and 10 percent. In one embodiment, the ratio of the blade length 344 and the diameter D1 of the first portion is in a range between 0.6 percent and 8 percent. Other ranges are contemplated. In one embodiment, a vertical projection area of the blades, when in a rotational action, is within a lateral cross-sectional area of the second portion 32.

In one embodiment, the blades 342 can be made of materials that are not sensitive to reactant gases, i.e., reactant gases do not react with the surface of the blades. In one embodiment, the blades can include ceramic or stainless steel. The blades can have any shape operable to generate a centrifugal force when in a rotational action to divert oversized particles away from the rotatable shaft.

In some embodiments, the ratio of the diameter D1 of the first portion 31 and the diameter D2 of the second portion 32 is in the range between 1.5 and 100. In some embodiments, the ratio of the diameter D1 of the first portion 31 and the diameter D2 of the second portion 32 is in the range between 2 and 80. In some embodiments, the ratio of the diameter D3 of the third portion 33 and the diameter D1 of the first portion 31 is in the range between 1 and 10. In some embodiments, the ratio of the diameter D3 of the third portion 33 and the diameter D1 of the first portion 31 is in the range between 1.2 and 5.

In some embodiments, the first, second, and third portions may have an oval or polygonal cross-section body. In such cases, the second portion 32 has an inner cross-sectional area smaller than an inner cross-sectional area of the first portion 31. In one embodiment, the inner cross-sectional area of the first portion 31 is about 50 times to 500 times greater than the inner cross-sectional area of the second cylindrical portion 32. In one embodiment, the inner cross-sectional area of the third cylindrical portion 33 is equal to or about 1.1 to 4 times greater than the inner cross-sectional area of the first cylindrical portion 31.

In one embodiment, the first, second, and third portions each can include a cylindrical inner wall having a same longitudinal center axis, and the rotatable shaft 341 is arranged substantially in the longitudinal center axis. The inner wall surface can be coated with a dielectric material having hydrophobic properties. In one embodiment, the first, second, and third portions each can include a material that does not react to the reactant gases flowing there-through. In one embodiment, the first, second, and third portions each can be made of aluminum, copper, or stainless steel.

Figure 4:
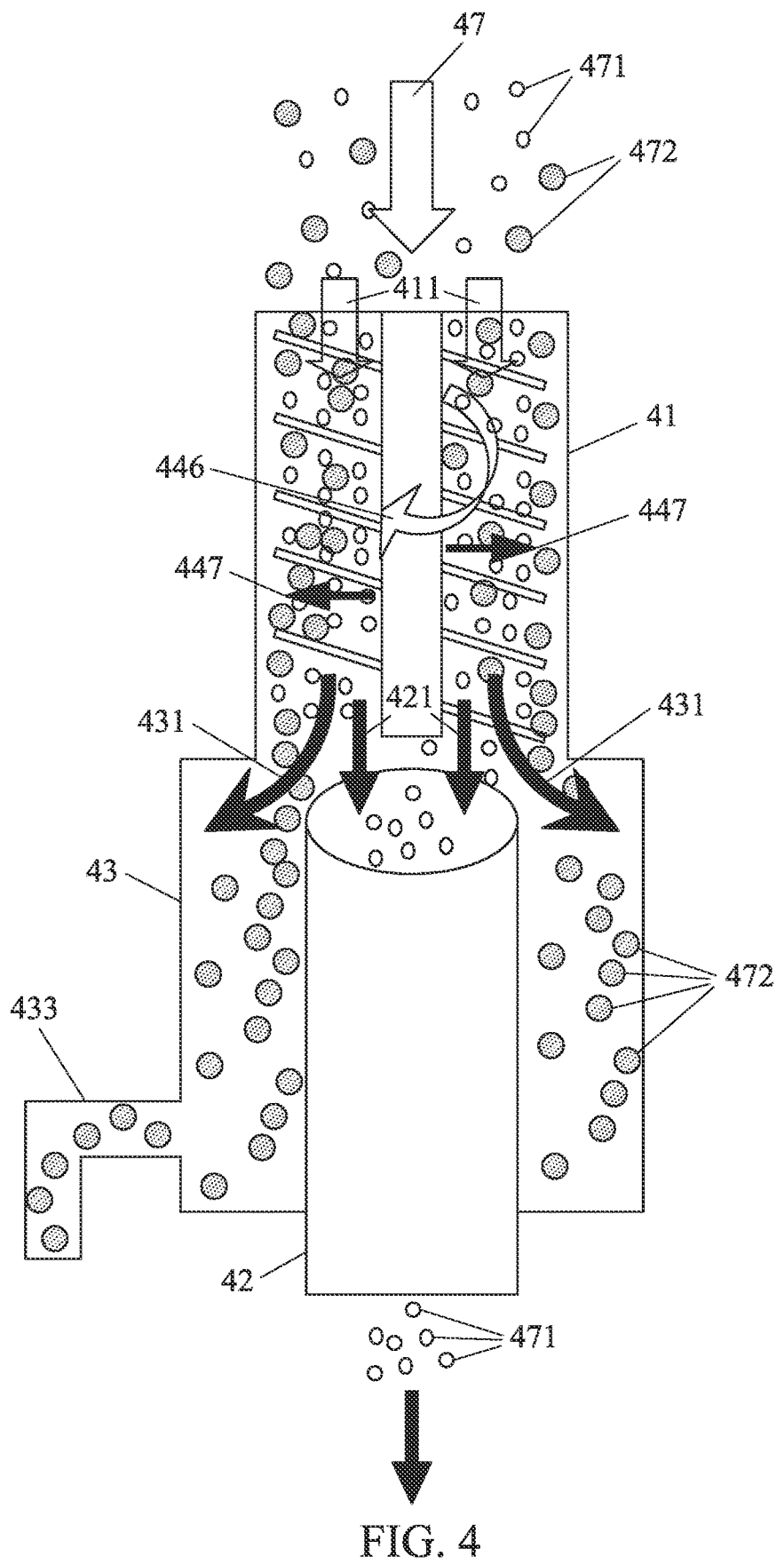
FIG. 4 is a simplified schematic diagram of an exemplary particle removing operation of a particle remover utilizing a centrifugal force according to some embodiments.

FIG. 4 is a simplified schematic diagram of an exemplary particle removing operation of a particle remover 40 utilizing a centrifugal force 447 according to an embodiment. In various embodiments, structures shown for particle remover 40 in this figure are included the particle remover 30 shown and described in FIG. 3. Referring to FIG. 4, a gas stream 47 is provided to a particle remover 40 by a precursor source. In this embodiment, the gas stream 47 includes reactant or carrier gases 471 and unwanted particles 472 having a size greater than a size of the reactant or carrier gases 471. In this embodiment, the particle remover 40 has a first portion 41 having a flow pathway 411 for receiving the gas stream 47. In some implementations, the gas stream 47 may have a flow rate sufficiently high to rotate the blades of the particle remover 40 at a rotation speed 446 to generate a centrifugal force 447 for diverting the unwanted particles 472 to a peripheral inner wall of the first portion 41. In those implementations, the blades are operable to divert unwanted particles 472 by impact outwardly toward the peripheral inner wall of the first portion 41. The oversized particles can be heavier than the gaseous elements (target or desired reactants) in the reactant gas and carrier gas and can be diverted away from the longitudinal center axis more than the desired gaseous elements that are lighter and smaller. It is noted that the flow force of the incoming gas stream is greater than the centrifugal force. The lighter gases 471 will continue to travel in the direction of the air flow toward the second portion 42 though a main pathway 421 and provide to a reaction chamber. The heavier and diverted unwanted particles will continue to travel along a side pathway 431 toward the third portion 43. In one embodiment, the third portion 43 can include an output portion 433 for providing the unwanted particles to a collection reservoir.

FIGS. 5A-D are perspective view diagrams illustrating a plurality of blades 542 arranged on a surface of a rotatable shaft 541 according to some embodiments. In some embodiments, the blades 542 can be the blades 342 of FIG. 3. One insight provided by the present inventors is that, when the blades are staggered on the surface of the rotatable shaft, i.e., the blades are not arranged in the same plane, unwanted particles can be more efficiently removed or diverted from the reactant gas stream. Another insight provided by the present inventors is that, when the blades are arranged at an angle that is not perpendicular to the surface of the rotatable shaft, a better separation result of unwanted particles from the desired reactant or carrier gas can be obtained. It will be appreciated that the number of blades disposed on the surface of the rotatable shaft can be any integer number. In the examples shown in FIGS. 5A through 5D, four blades are used, but it is understood that the number is illustrative only for describing exemplary embodiments and should not be limiting. It is also understood that four different shapes are shown in FIGS. 5A through 5D, those skilled in the art will appreciate that other shapes are also possible and should not limit to a particular embodiment of the present disclosure.

Figure 6A:
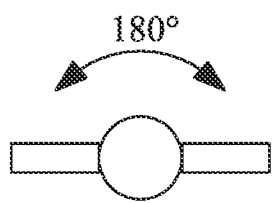
FIGS. 6A-D are simplified top view diagrams illustrating various configurations of blades according to some embodiments.
Figure 6B:
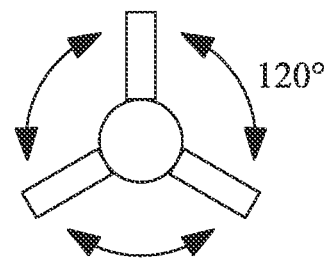
Figure 6C:
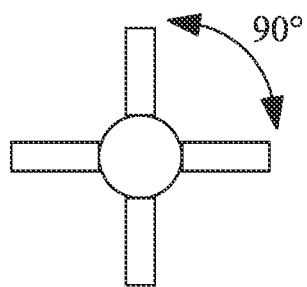
Figure 6D:
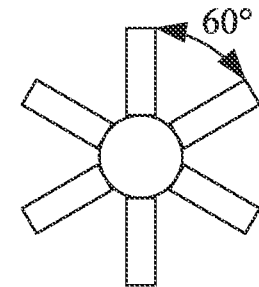

FIGS. 6A-6D are simplified top view diagrams illustrating various configurations of blades according to some embodiments. In some embodiments, the configurations of blades can be those of FIGS. 5A-5D. FIG. 6A shows that the blades are staggered on opposite side of the rotation shaft (i.e., at 180 degrees). FIG. 6B shows that the blades are staggered and arranged at 120 degrees with respect to a direction perpendicular to the rotation shaft. FIG. 6C shows that the blades are staggered and arranged at 90 degrees with respect to a direction perpendicular to the rotation shaft. FIG. 6D shows that the blades are staggered and arranged at 60 degrees with respect to a direction perpendicular to the rotation shaft. For simplicity reason, only four configuration of blades are shown. Those of skilled in the art will appreciate that other configurations of blades may be used, e.g., five or more blades can be staggered and arranged relative to each other at 72 degrees when viewing from the top. Of course, other variations, modifications, and alternatives can also be used.

Figure 7A:
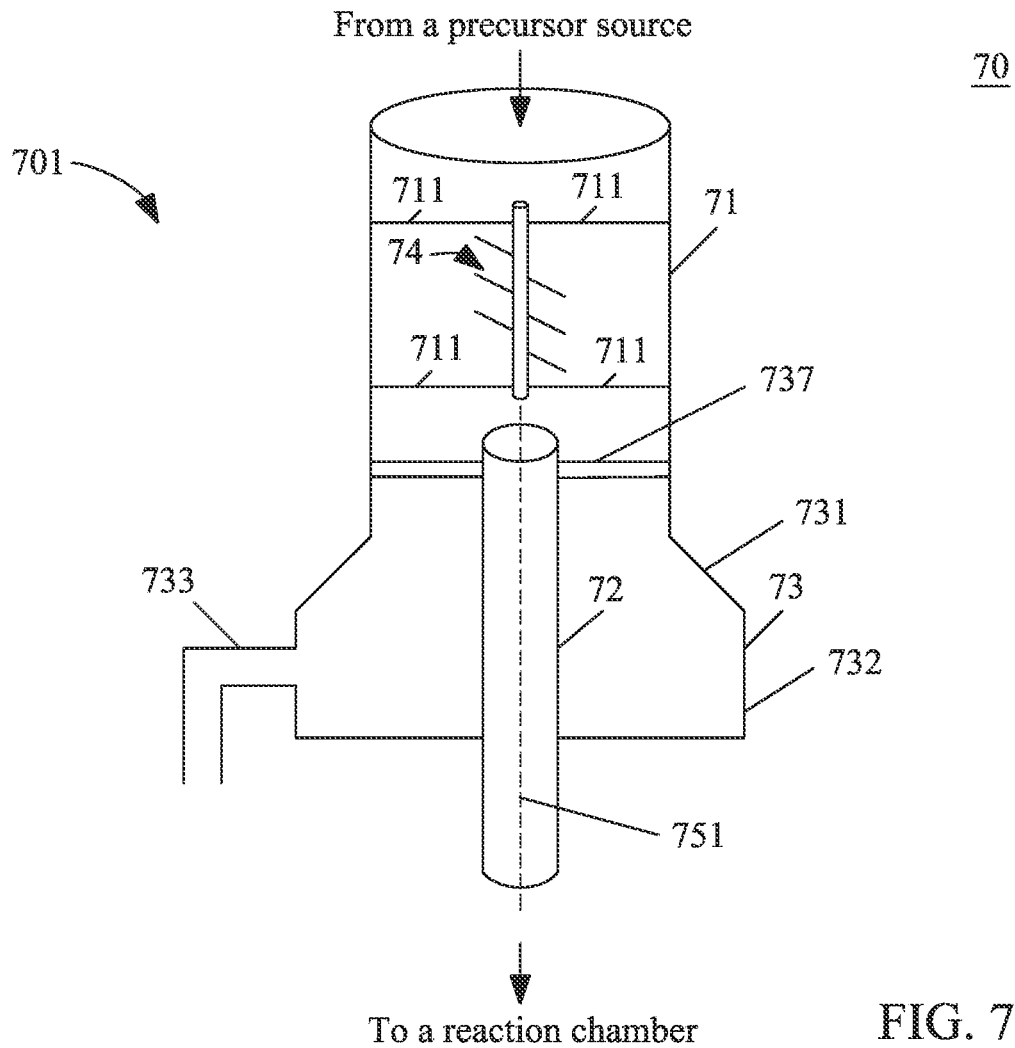
FIG. 7A is a simplified cross-sectional view diagram of a particle remover having a housing according to some embodiments.

FIG. 7A is a simplified cross-sectional view diagram of a particle remover 70 having a housing 701 according to an embodiment. Referring to FIG. 7A, the housing 701 includes a first cylindrical portion 71, a second cylindrical portion 72 connected to an inner wall surface of the first portion 71 through a support connection 737, and a third cylindrical portion 73 connected to an outer wall surface of the first cylindrical portion 71. In some implementations, the third cylindrical portion 73 can have a conical top portion 731 and a straight bottom portion 732. In this embodiment, the particle remover 70 further include a rotatable device 74 having a rotatable shaft and a plurality of blades mounted on the surface thereon. The rotatable device 74 can be installed as a unit in the hollow structure of the first cylindrical portion 71 and configured to generate a centrifugal force for removing unwanted particles embedded in a gas stream provided to the first cylindrical portion 71, when the rotatable device rotates. In some implementations, the rotatable device 74 can be self-rotating driven by a flow rate of the gas stream, i.e., the gas stream flowing along the rotatable shaft may cause the rotatable device to rotate. In some implementations, the rotatable device 74 can be driven by an electric motor coupled to the rotatable shaft. In some implementations, the rotatable device 74 can be designed to rotate at a predetermined rotation speed by selecting the number, the location, and the shape of the blades. For this purpose, the rotatable device 74 is designed to be easily mounted and removed from the particle remover 70. In other words, the rotatable device 74 can have different dimensions and different types (shapes, size, location) of the blades. In one embodiment, the rotatable device 74 can be placed on a bracket 711 that is attached or mounted to the surface of the inner wall of the first cylindrical portion 71.

Figure 7B:
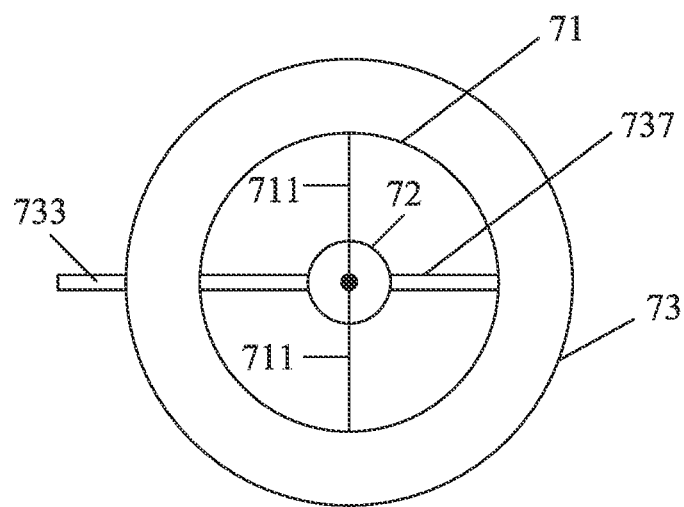
FIG. 7B is a simplified top view diagram of the particle remover in FIG. 7A.

FIG. 7B is a simplified top view diagram of the particle remover 70 in FIG. 7A. Referring to FIGS. 7A and 7B, the first, second, and third cylindrical portions 71, 72, and 73 have a common vertical longitudinal axis 751. The second cylindrical portion 72 is connected to an inner wall of the first cylindrical portion 71 using support connections 737 in a spoke structure. It is understood that the number of support connections can be any integer number. In the example shown in FIG. 7B, two support connections are used to couple the top portion of the second cylindrical portion 72 with the first cylindrical portion 71, but it is to be understood that the number is illustrative only and is chose for describing the example embodiment and should not be limiting. In one embodiment, the second cylindrical portion 72 has an inner cross-sectional area equal to or smaller than an inner cross-sectional area of the first cylindrical portion 71.

Referring to FIGS. 7A and 7B, in some embodiments, the first, second, and third cylindrical portions each can have a straight cylindrical wall. In other embodiments, the first and second cylindrical portions each can have a straight cylindrical wall, and the third cylindrical portion can have a conical top wall and a straight bottom portion, where the cross-sectional area of the bottom portion is larger than the cross-sectional area of the conical top portion.

In some embodiments, each of the first, second, and third portions can be defined by three dimensions: diameter at a top portion, diameter at a bottom portion, and length. In one embodiment, each of the first, second, and third portions has a straight-wall cylindrical shape (i.e., the top diameter and the bottom diameter are substantially the same). The first portion has a diameter in a range between 2 cm and 8 cm, and a length in a range between 5 cm and 10 cm. The second portion has a diameter in a range between 0.1 cm and 1 cm, and a length in a range between 5 cm and 10 cm. The third portion has a diameter in a range between 2 cm and 10 cm, and a length in a range between 5 cm and 10 cm. In one embodiment, the first, second, and third portions have a substantially the same length. In one embodiment, the rotatable shaft has a length in a range between 5 cm and 10 cm. In one embodiment, the blades has a length between 0.05 cm and 0.15 cm and are arranged staggered on the surface of the rotatable shaft at a distance between 0.01 cm and 0.5 cm. In one embodiment, the blades are arranged on the surface of the rotatable shaft at an angle in a range between 1 degree and 89 degrees. It is to be understood that the dimensions and shapes provided herein are exemplary and not limiting. It will be appreciated that other dimensions and shapes are also possible.

Figure 8:
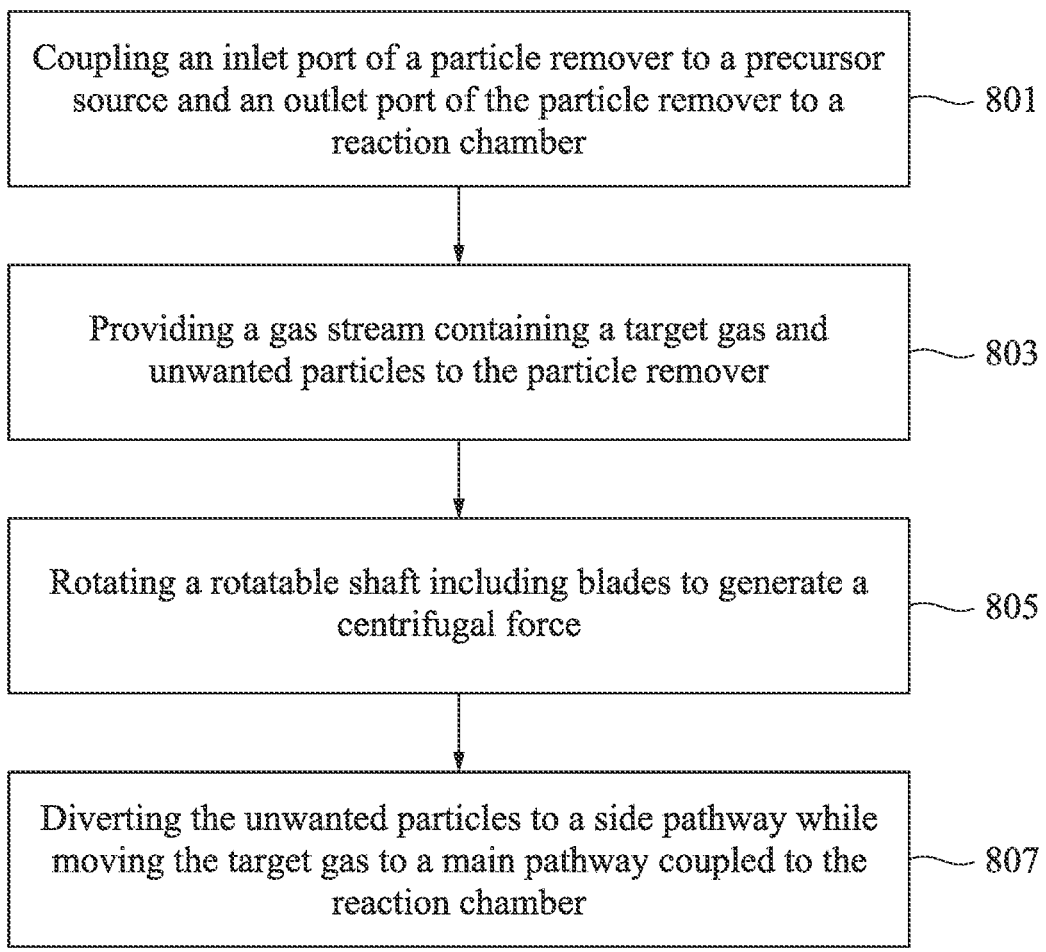
FIG. 8 is a simplified flowchart illustrating a method of delivering a precursor gas of a precursor source to a reaction chamber according to some embodiments.

FIG. 8 is a simplified flowchart illustrating a method 80 of delivering a precursor gas of a precursor source to a reaction chamber according to an embodiment. As an example, the systems depicted in FIGS. 1A, 1B, 1C, 1D, 2, and the particle remover depicted in FIGS. 3 through 7A and 7B can utilize the process illustrated in FIG. 8 for delivering a precursor gas of a precursor source to a reaction chamber. The method 80 includes coupling an inlet port of a particle remover to the precursor source and an outlet port of the particle remover to the reaction chamber (801). For example, referring to FIG. 2, the particle remover 27 is coupled to the precursor source 21 using the inlet port 271 and to the reaction chamber 22 using the outlet port 272. The method 80 further includes providing a gas stream containing the target precursor gas and unwanted particles to the particle remover disposed between the precursor source and the reaction chamber (803). In an embodiment, referring to FIG. 4, the gas stream 47 containing reactant or carrier gases 471 and unwanted particles 472 is provided to the particle remover 40. In an exemplary embodiment, the particle remover can include a rotatable shaft having a plurality to blades arranged on a surface thereof. Referring to FIG. 3, the particle remover 30 includes a rotatable shaft 341 having a plurality of blades 342 arranged on its surface. The method 80 may also include rotating the rotatable shaft such that the blades, when in a rotational action, generate a centrifugal force to divert the unwanted particles towards a periphery of the particle remover (805); and diverting the unwanted particles to a side pathway coupled to a collection reservoir while moving the desired precursor gas toward a main pathway coupled to the reaction chamber (807). Referring to FIG. 4, the blades arranged on the rotatable shaft, when in a rotational action at a certain rotation speed 446, generate a centrifugal force 447. The unwanted particles 472 are diverted to a side pathway 431, and the desired reactant or carrier gases are moved toward a main pathway 421 coupled to the reaction chamber. In some embodiments, the method 80 further includes collecting the unwanted particles in the collection reservoir for recycling.

It should be appreciated that the specific steps illustrated in FIG. 8 provide a particular method of delivering a precursor gas of a precursor source to a reaction chamber according to an exemplary embodiment. In some embodiments, the air stream flowing along the rotatable shaft causes the blades to rotate. In other embodiments, an electric motor coupled to the rotatable shaft may be used to rotate the rotatable shaft at a predetermined speed. The electric motor may be driven by an electrical signal provided by a control system. One of ordinary skill in the art would recognize many variations, modifications, and alternatives.

The present inventors conducted various experiments and found that particles had fallen on a center region of a substrate in a conventional copper seed chemical vapor deposition process. When these particles are trapped in through holes or vias, the vias cannot be completely filled with copper, causing semiconductor devices to fail and a loss in wafer yield. FIG. 9 illustrates one embodiment of an apparatus employing a particle remover in accordance with the disclosure, for example the particle remover shown in FIG. 4 and described herein. In this embodiment, using the particle remover in accordance with the disclosure, installed between the gas line module and the ALD chamber as shown, can improve wafer yield.

The present inventors also discovered that similar issues occurred when filling vias with tungsten. The trapped particles prevented vias from completely filled with tungsten. FIG. 11 shows a particle remover in accordance with the disclosure is installed in front of the chamber in a glue layer (CVD TiN) process. In this embodiment, particles are removed from the gas stream by the particle remover, and obtained better wafer yield.

When a particle remover is installed in front of the reaction chamber, the present inventors discovered that particles are removed from the gas stream by the particle remover, and obtained better wafer yield. In some high-k dielectric deposition processes, the inventors also discovered that humps appeared on the high-k dielectric layer due to deposited particles that caused non-conformal high-k dielectric layers. The non-conformal high-k dielectric layers could cause uneven thicknesses of subsequently deposited layers, thereby affecting performance and yield of semiconductor devices. The present inventors discovered that high-k dielectric layers formed on the wafer had even and conformal thicknesses when a particle remover was installed in the wafer process system, e.g., in front of the reaction chamber, and higher performance and yield were achieved.

FIG. 10 illustrates an embodiment of a wafer process system, where a particle remover is installed, e.g., in front of the reaction chamber as shown. In this embodiment, higher performance and yield were achieved such that high-k dielectric layers formed on the wafer had even and conformal thicknesses.

It should be understood that FIGS. 9-11 are shown merely as non-limiting examples of various situations where a particle remover in accordance with the present disclosure may be used to improve wafer yield. The structures shown in those figures are merely illustrative and thus should not be used to limit the scope of present disclosure.

A particle remover provided accordingly to some embodiments includes a first portion, a second portion coupled to the first portion, and a third portion coupled to the first portion. The flow pathway of the first portion is configured to receive a gas stream having a flow rate. The flow pathway of the first portion includes a rotatable device (a rotatable device configured to generate a centrifugal force when in a rotational action) disposed along a longitudinal axis of the first portion and configured to generate a centrifugal force to divert unwanted particles away from the longitudinal axis.

The second portion includes a main pathway configured to receive the gas stream with the unwanted particles have been substantially diverted by the centrifugal force. The third portion includes a side pathway configured to receive the diverted particles. In one embodiment, the third portion may include an output port coupled to a collection reservoir for collecting the unwanted particles for recycling.

In one embodiment, the first, second, third portions, and the rotatable device can be fabricated in separated process steps and assembled together. In one embodiment, the first and second portions can be assembled together using a plurality of support connections in a spoke structure. In one embodiment, the first, second, and third portions can have the same material. It will be appreciated that the first, second, third portions, and the rotatable device can have a variety of shapes and sizes.

In an embodiment, each of the first, second, and third portions has an elongated cylindrical body. In one embodiment, the first, second, and third portions are arranged along a same longitudinal center axis, and the rotatable shaft is configured to rotate around the same longitudinal center axis. In one embodiment, an air pressure can rotate the rotational shaft including the staggered blades mounted thereon. The air pressure can be generate from a pressure difference between the inlet and the outlet of the particle remover.

In one embodiment, the first cylindrical portion has a cross-sectional area that is equal to or greater than a cross-sectional area of the second cylindrical portion, and the third cylindrical portion has a cross-sectional area that is greater than a cross-sectional area of the first cylindrical portion.

In one embodiment, the particle remover can include an electric motor that causes the rotatable shaft to rotate. The staggered blades, when in a rotational action, may provide a centrifugal force to the particles when the gas stream acts on the blades. The particle remover can be designed to rotate at a predetermined rpm (rotations per minute) by adjusting the electrical signal provided to control the electric motor. The rpm can also be determined by selecting the number, shape, size, angle, and location of the blades. In one embodiment, the rotatable shaft can be rotated between 100 rotations per minutes to 2000 rotations per minutes.

In one embodiment, a wafer process system is disclosed. The wafer process system includes a precursor source configured to provide a gas stream, a reaction chamber, and a particle remover disposed between the precursor source and the reaction chamber. The particle remover includes a first cylindrical portion configured to receive the gas stream containing a target gas and unwanted particles, a rotatable device disposed within the first cylindrical portion and configured to generate a centrifugal force, when in a rotational action, to divert the unwanted particles away from the rotatable device. The particle remover also includes a second cylindrical portion coupled to the first cylindrical portion and configured to receive the target gas, and a third cylindrical portion coupled to the first cylindrical portion and surrounding the second cylindrical portion. The third cylindrical portion is configured to receive the unwanted particles. The particle remover further includes a collection reservoir coupled to the third cylindrical portion and configured to collect the unwanted particles for recycling.

In one embodiment, a method of delivering a gas stream to a reaction chamber may include providing a particle remover configured to receive the gas stream that may contain a target gas and unwanted particles. The particle remover includes a rotatable shaft and a plurality of staggered blades disposed on a surface of the rotatable shaft. The method also includes rotating the rotation shaft to generate a centrifugal force to drive the unwanted particles away from the rotation shaft, and diverting the unwanted particles to a side pathway while moving the target gas toward a main pathway coupled to the reaction chamber.

Using embodiments of the present disclosure, it is possible to divert (separate or remove) unwanted particles from a gas stream through a rotatable device disposed in a first portion of a particle remover. The rotatable device can have a rotation shaft and a plurality of blades arranged staggered on the surface of the rotation shaft and a predetermined distance and an angle. The gas stream received by the first portion can cause the blades to rotate at a rotation speed sufficient to generate a centrifugal force for diverting the unwanted particles to a peripheral inner wall of the first portion and then to the side pathway of the third portion.

While the advantages and embodiments of the present disclosure have been depicted and described, there are many more possible embodiments, applications and advantages without deviating from the scope of the inventive concepts described herein.

It will be apparent to those skilled in the art that various changes, substitutions, and modifications can be made hereto without departing from the scope of the present disclosure as defined in the appended claims.

What is claimed is:

1. A device for removing particles in a gas stream, the device comprising:
    a reaction chamber configured to deposit a film on a wafer;
    a first cylindrical portion configured to receive the gas stream, from a precursor source of a wafer process system, containing a target gas and the particles;
    a rotatable device disposed within the first cylindrical portion and configured to generate a centrifugal force when in a rotational action to divert the particles away from the rotatable device, wherein the rotatable device comprises:
        a rotatable shaft arranged in an elongated direction of the first cylindrical portion; and
        a plurality of staggered blades disposed on a surface of the rotation shaft;
    a second cylindrical portion coupled to the first cylindrical portion and configured to receive the target gas and deliver the target gas to the reaction chamber of the wafer process system, wherein the device is disposed upstream of the reaction chamber; and
    a third cylindrical portion coupled to the first cylindrical portion and surrounding the second cylindrical portion, the third cylindrical portion being configured to receive the particles.

2. The device of claim 1, wherein the plurality of staggered blades are arranged at an angle not perpendicular to the surface of the rotation shaft.

3. The device of claim 1, wherein the rotatable device is disposed externally to the second cylindrical portion and the third cylindrical portion.

4. The device of claim 1, further comprising an electric motor coupled to the rotatable device and configured to rotate the rotatable device.

5. The device of claim 1, further comprising a plurality of support connections configured to couple a portion of the second cylindrical portion to an inner wall of the first cylindrical portion in a spoke structure.

6. The device of claim 1, wherein the first, second, and third cylindrical portions have a same longitudinal center axis.

7. The device of claim 1, wherein a cross-sectional area of the first cylindrical portion is equal to or greater than a cross-sectional area of the second cylindrical portion, and a cross-sectional area of the third cylindrical portion is greater than a cross-sectional area of the first cylindrical portion.

8. The device of claim 1, wherein the third cylindrical portion comprises an outlet coupled to a collection reservoir configured to collect the diverted particles.

9. The device of claim 1, further comprising:
an inlet configured to couple to the precursor source through a first fastening element; and
an outlet configured to couple to the reaction chamber through a second fastening element.

10. The device of claim 9, wherein the first and second fastening elements each comprise one or more screws, nuts and bolts.

11. The device of claim 1, wherein the rotatable device is placed on a bracket that is mounted on an inner wall of the first cylindrical portion.

12. The device of claim 1, wherein the first, second, and third cylindrical portions each comprise a circular shape.

13. The device of claim 1, wherein the target gas is used for a deposition process in the reaction chamber of the wafer process system.

14. The device of claim 13, wherein the deposition process is a chemical vapor deposition (CVD) process.

15. The device of claim 13, wherein the deposition process is an atomic layer deposition (ALD) process.

16. A wafer process system comprising:
a precursor source configured to provide a gas stream;
a reaction chamber configured to deposit a film on a wafer; and
a particle remover disposed between the precursor source and the reaction chamber and upstream of the reaction chamber, the particle remover comprising:
a first cylindrical portion configured to receive, from the precursor source of the wafer process system, the gas stream containing a target gas and particles;
a rotatable device disposed within the first cylindrical portion and configured to generate a centrifugal force when in a rotational action to divert the particles away from the rotatable device, wherein the rotatable device comprises:
a rotatable shaft arranged in an elongated direction of the first cylindrical portion; and
a plurality of staggered blades disposed on a surface of the rotation shaft;
a second cylindrical portion coupled to the first cylindrical portion and configured to receive the target gas and deliver the target gas to the reaction chamber of the wafer process system; and
a third cylindrical portion coupled to the first cylindrical portion and surrounding the second cylindrical portion, the third cylindrical portion being configured to receive the particles.

17. The wafer process system of claim 16, wherein the rotatable device further comprises:
an electric motor coupled to the rotatable shaft and configured to rotate the rotatable shaft when the first cylindrical portion receives the gas stream.

18. The wafer process system of claim 16, wherein the target gas is used for a deposition process in the reaction chamber of the wafer process system.

19. A wafer process system comprising:
a precursor source configured to provide a gas stream containing a target gas and particles;
a reaction chamber configured to deposit a film on a wafer using the target gas; and
a particle remover disposed between the precursor source and the reaction chamber and upstream of the reaction chamber, the particle remover comprising:
a first cylindrical portion configured to receive, from the precursor source of the wafer process system, the gas stream containing a target gas and particles;
a rotatable device disposed within the first cylindrical portion and configured to generate a centrifugal force when in a rotational action to divert the particles away from the rotatable device, wherein the rotatable device comprises:
a rotatable shaft arranged in an elongated direction of the first cylindrical portion; and
a plurality of staggered blades disposed on a surface of the rotation shaft;
a second cylindrical portion coupled to the first cylindrical portion and configured to receive the target gas and deliver the target gas to the reaction chamber of the wafer process system; and
a third cylindrical portion coupled to the first cylindrical portion and surrounding the second cylindrical portion, the third cylindrical portion being configured to receive the particles.

20. The wafer process system of claim 19, wherein the plurality of staggered blades are arranged at an angle not perpendicular to the surface of the rotation shaft.

* * * * *